US006703767B1

United States Patent
Summers

(10) Patent No.: US 6,703,767 B1
(45) Date of Patent: Mar. 9, 2004

(54) PZT MICROACTUATOR

(75) Inventor: Robert Summers, Temecula, CA (US)

(73) Assignee: Magnecomp Corporation, Temecula, CA (US)

( * ) Notice: Subject to any disclaimer, the term of this patent is extended or adjusted under 35 U.S.C. 154(b) by 136 days.

(21) Appl. No.: 10/106,314

(22) Filed: Mar. 26, 2002

Related U.S. Application Data

(62) Division of application No. 09/772,354, filed on Jan. 29, 2001, now Pat. No. 6,393,681.
(60) Provisional application No. 60/263,021, filed on Jan. 22, 2001.

(51) Int. Cl.$^7$ .............................................. H01L 41/08
(52) U.S. Cl. ..................... 310/340; 29/25.35; 29/412; 29/415; 29/417; 156/257; 156/278; 427/212; 427/214
(58) Field of Search .................... 310/340; 29/25.35, 29/412, 415, 417; 156/257, 278; 427/100, 212, 213.3, 214, 284, 289; 451/41, 18, 54

(56) References Cited

U.S. PATENT DOCUMENTS

| 3,230,402 | A | * | 1/1966 | Nightengale et al. ....... 310/338 |
| 5,305,507 | A | * | 4/1994 | Dvorsky et al. ........... 29/25.35 |
| 5,891,595 | A | * | 4/1999 | Takeuchi ..................... 430/5 |
| 6,393,681 | B1 | * | 5/2002 | Summers .................. 29/25.35 |

* cited by examiner

*Primary Examiner*—Thomas M. Dougherty
(74) *Attorney, Agent, or Firm*—Louis J. Bachand

(57) ABSTRACT

PZT crystals are peripherally coated in manufacture by cutting a series of intersecting first kerfs in a wafer comprising a plurality of PZT crystal precursors, filling the kerfs with a coating resin, and cutting a second, narrower kerf in the locus of the first kerfs to separate the crystals while providing them a peripheral coating of the coating resin.

7 Claims, 3 Drawing Sheets

PZT MICROACTUATOR

CROSS-REFERENCE TO RELATED APPLICATIONS

This application is a division of U.S. application Ser. No. 09/772,354 filed on Jan. 29, 2001 U.S. Pat. No. 6,393,681, and further claims the benefit of U.S. Provisional Patent Application Ser. No. 60/263,021 filed Jan. 22, 2001.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention relates to the manufacture of piezoelectric crystals (PZT) and, more particularly, to the processing of PZT wafers to produce peripherally coated PZT crystals that will not contaminate their use environment, such as disk drive suspensions and hard disk drives. In a particular aspect the invention relates to improved methods of coating the PZT crystals, using a resin coating placed between adjacent crystal precursors in a kerf of a predetermined width that permits subsequent cutting of a narrower kerf that leaves the crystal sides coated upon later separation of the crystals from the wafer.

2. Description of the Related Art

PZT crystals are used to effect micromovements of the sliders in disk drives. The crystals may flake in this use environment and introduce contamination into the disk drive. To avoid this efforts have been made to shroud the crystals after their separation from the PZT wafer with plasma sprayed coatings. This is a costly expedient requiring expensive equipment, increased manufacturing time, and repeated handling of the individual crystals.

BRIEF SUMMARY OF THE INVENTION

It is an object of the invention, therefore, to provide a less costly solution to the PZT crystal contamination problem. It is a further object to modify the PZT crystal preparation at the wafer cutting level to have a coating formed on the crystal peripheries as a part of the crystal separation steps normally used. It is a further object to provide a wider first kerf between adjacent crystals, fill the first kerf with coating resin, such as epoxy resin, and then cut a second kerf in the first kerf to isolate the crystals with the coating resin adhered to their peripheries.

These and other objects of the invention to become apparent hereinafter are realized in a method for the manufacture of peripherally coated PZT crystals suitable for microactuation of a disk drive suspension from a wafer comprising a plurality of PZT crystal precursors, including cutting in a locus between adjacent precursors a first kerf of a predetermined width to cut apart the precursors and reveal the sides thereof, depositing into the first kerf a coating resin that fills the first kerf and coats the precursor sides, solidifying the coating resin in place, cutting in the solidified coating resin at the locus a second kerf of less width than the first kerf, the second kerf cutting through the coating and between the adjacent precursors in spaced relation to the precursor sides to again cut apart the precursors while maintaining the solidified coating resin in place on the precursor sides, whereby the precursors become PZT crystals having a side coating against flaking of detritus therefrom into a disk drive suspension containing the crystals.

In this and like embodiments, typically, the method further includes cutting the wafer in a grid pattern comprising a series of intersecting first kerfs to define the plurality of crystal precursors, and using as the coating resin a flowable resin that cures to a solid, such as an epoxy resin, The invention further provides a peripherally coated PZT crystal made by the above method, and more specifically a PZT crystal suitable for microactuation of a disk drive suspension, in which the crystal has on the vertical sides thereof a peripheral coating of a resin applied at a first thickness and cut to a second thickness to block flaking of detritus from the crystal into a disk drive suspension, the coating resin comprising an epoxy resin.

In another aspect the invention provides a wafer comprising a plurality of PZT crystal precursors separated by a first kerf, the first kerf being filled with a coating resin, and in which the first kerf has a second kerf formed therein.

BRIEF DESCRIPTION OF THE SEVERAL VIEWS OF THE DRAWINGS

The invention will be further described in conjunction with the attached drawings in which.

DETAILED DESCRIPTION OF THE INVENTION

Figure 1:
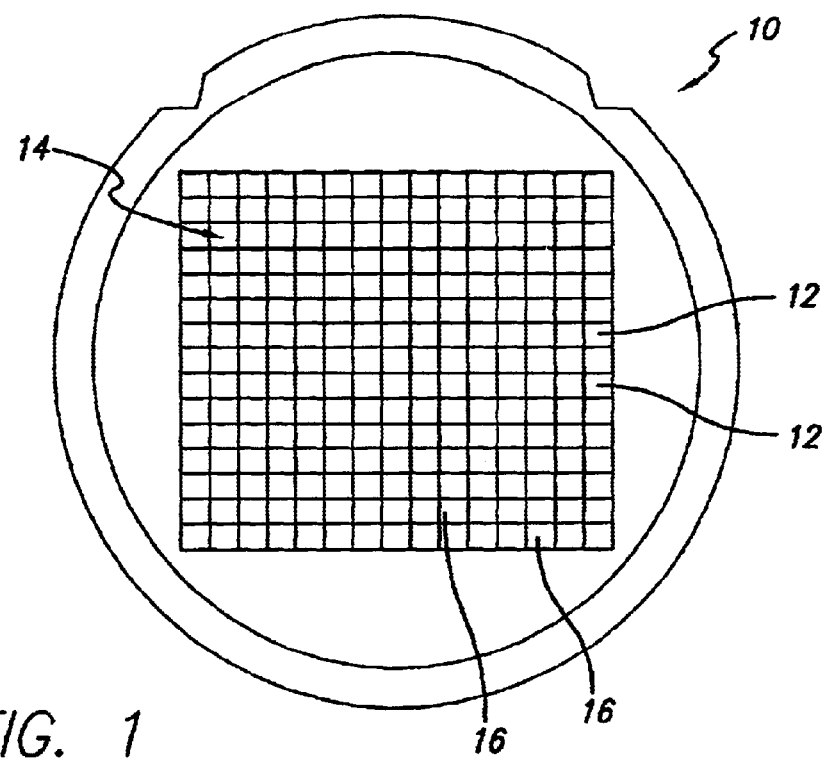
FIG. 1 is a plan view of a PZT crystal wafer with a grid cut into it to define the individual crystals.
Figure 2:
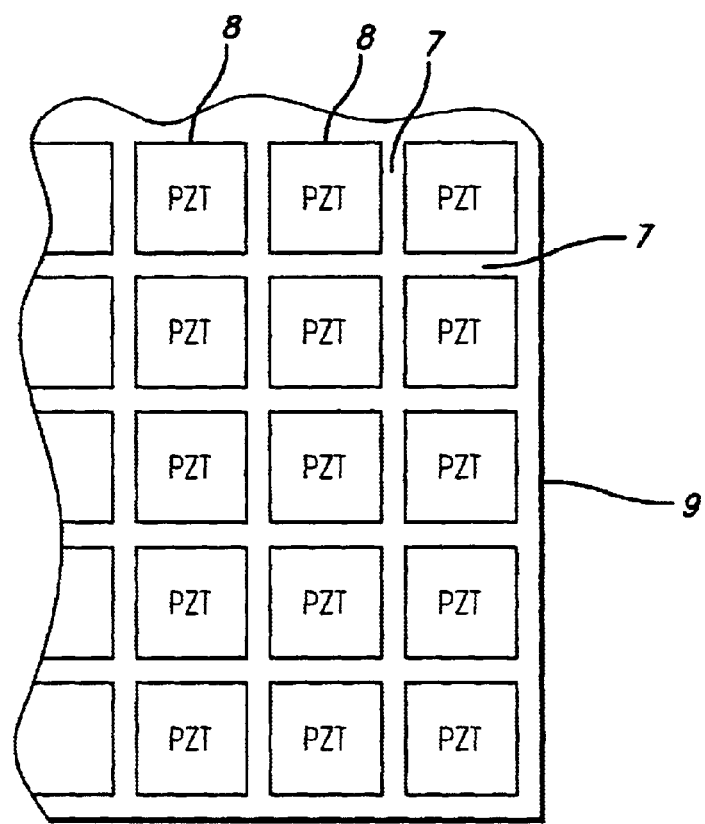
FIG. 2 is a PRIOR ART plan view, greatly enlarged, of a fragment of a PZT wafer with the individual crystals defined by intersecting narrow kerfs.
Figure 3:
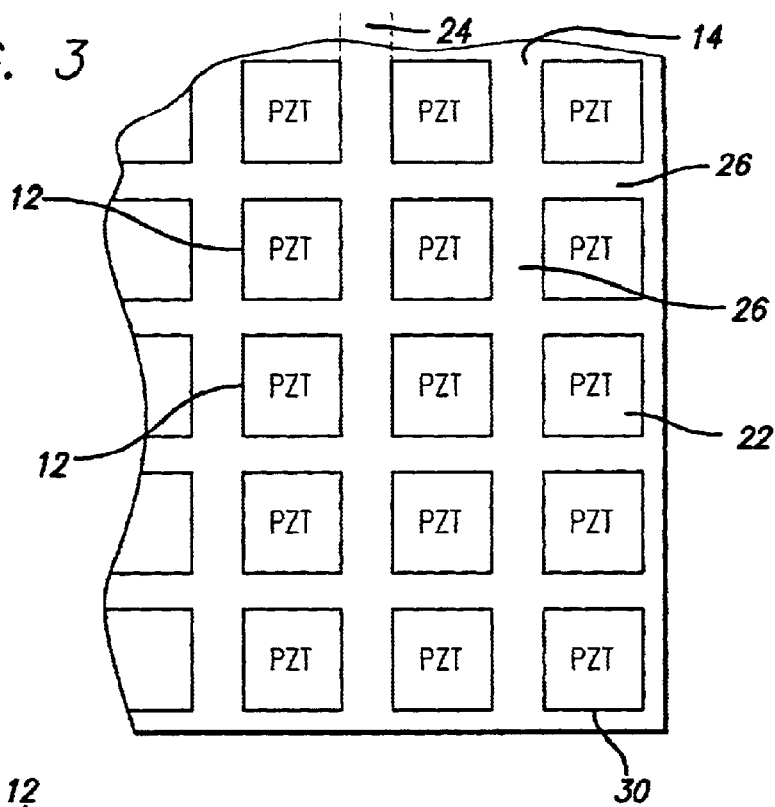
FIG. 3 is a plan view, greatly enlarged, of a fragment of a PZT wafer with the individual crystals defined by intersecting wide firsts kerfs according to the invention.

With reference now to the drawings in detail, in FIG. 1 a typical PZT crystal wafer is shown at 10. Individual PZT crystal precursors 12 (labeled PZT in FIGS. 4 and 4) are separated from the bulk of the wafer 10 by cutting a grid pattern 14 of kerfs 16 on the wafer by known means. In FIG. 2 PRIOR ART the heretofore-typical kerf 7 or cut between adjacent precursors 8 is shown to be about 0.003" in width in the crystal wafer 9.

With reference to FIGS. 3, 4, 5 and 6, the invention method is for the manufacture from wafer 10 of peripherally coated PZT crystals 18 (FIG. 6) that will be suitable for microactuation of a disk drive suspension. The method includes cutting the grid 14 of intersecting kerfs 26 into the wafer 10 that comprises a PZT crystal 22 capable of being subdivided into a plurality of PZT crystal precursors 12. The cutting is made in a locus 24 between adjacent precursors 12. In accordance with the invention the first cutting forms a first kerf 26 of about 0.009" in width, much wider than the previous width of 0.003" shown in FIG. 2 PRIOR ART. The invention first kerf 26 cuts apart the PZT crystal precursors 12 and reveals the sides 30 thereof. See FIG. 3.

Figure 4:
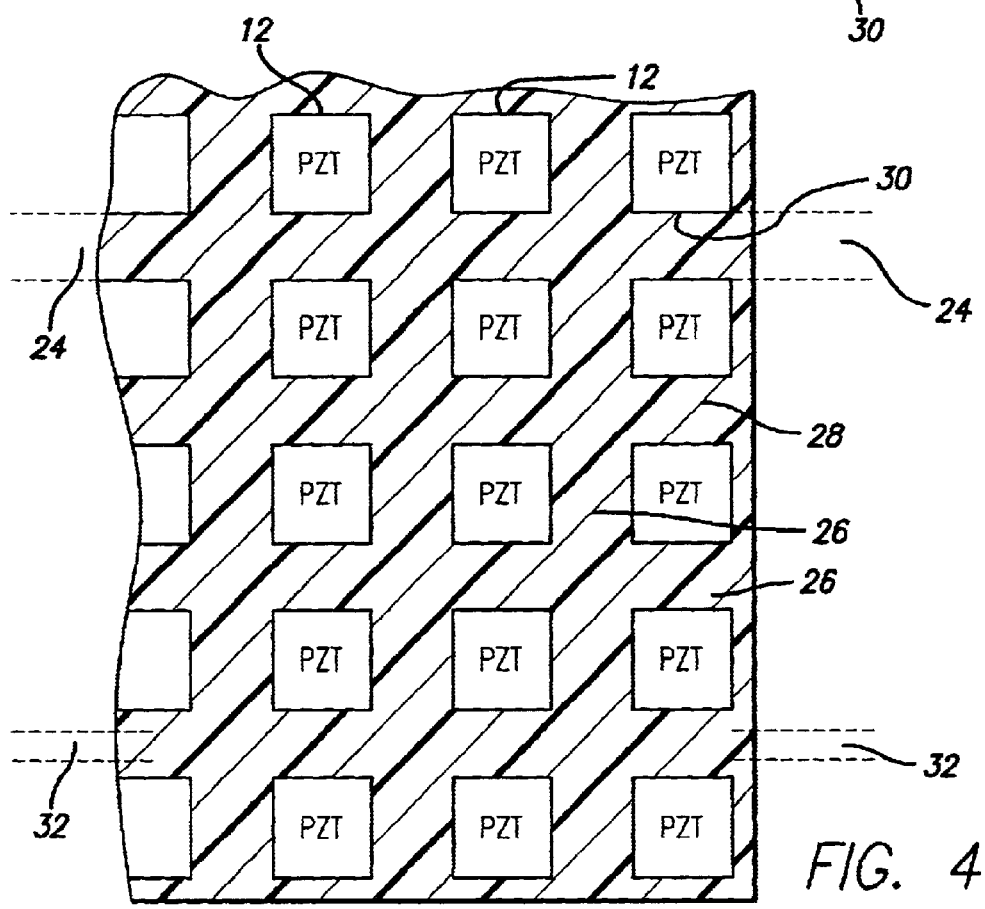
FIG. 4 is a view like FIG. 3 of a portion of the PZT wafer with coating resin in the first kerfs.
Figure 5:
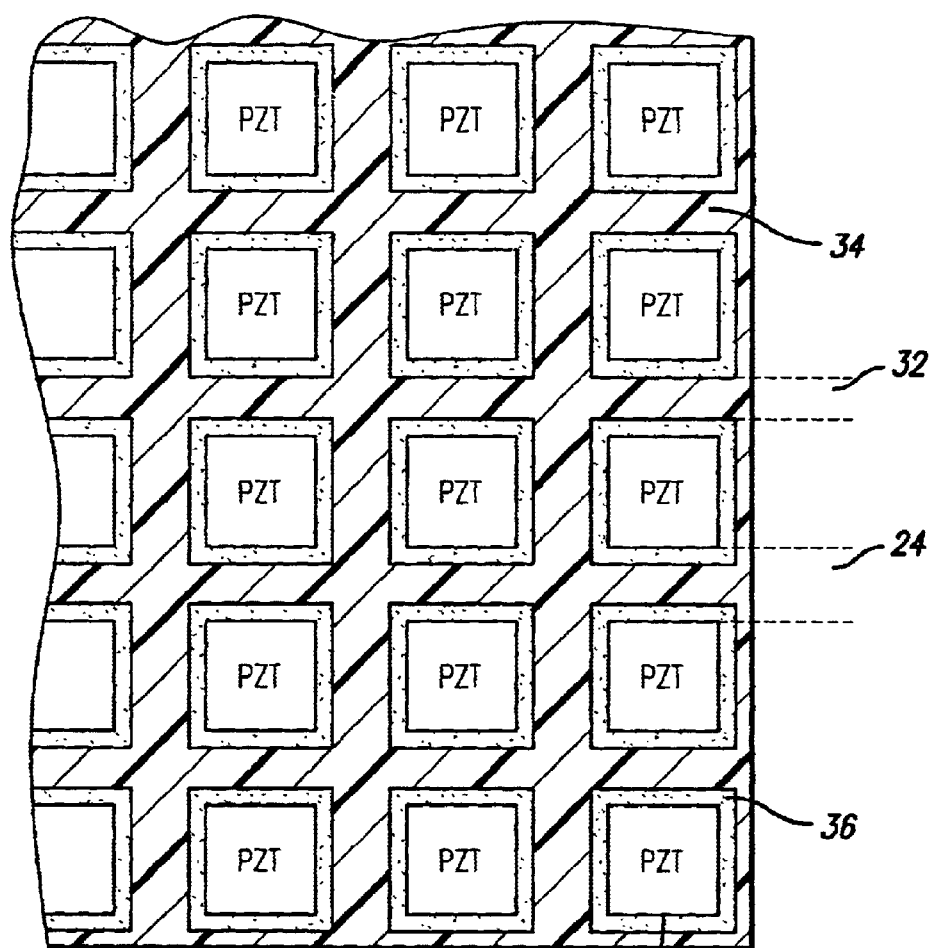
FIG. 5 is a view like FIG. 4 of a portion of the PZT wafer with second kerfs cut into the coating resin in the first kerfs separating adjacent crystals with the coating resin adhered to the crystal peripheries; and, FIG. 6 is an isometric view of an individual crystal with the coating resin about its periphery.
Figure 6:
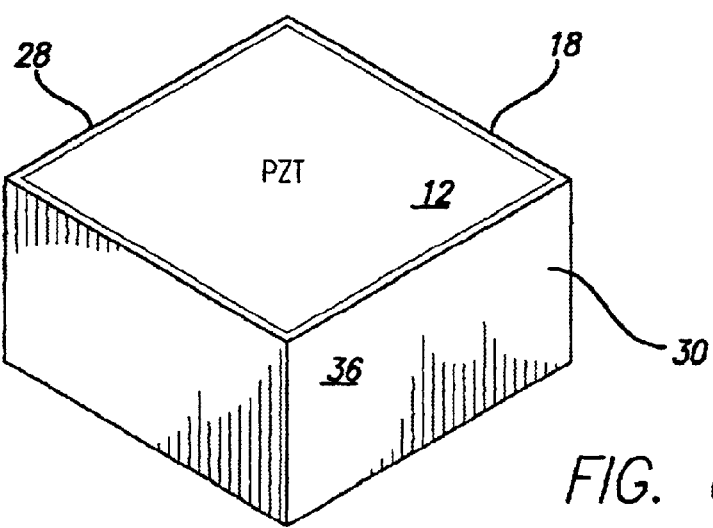

In the next step, shown in FIGS. 4 and 5, a coating resin such as epoxy, or any other curable or hardenable resin 28 that is adherent to the crystal precursors 12, flowable to be depositable in to the kerf 26, and chemically compatible with the disk drive application envisioned for the PZT crystals 18, is deposited into the first kerf 26 to fill the first kerf and coat exposed sides 30 of the PZT crystal precursors 12. The coating resin 28 is solidified in place filling the first kerf 26, FIG. 4.

In the next step, the solidified coating resin 28 is cut at a predetermined locus 32 between the crystal precursors 12 for a second kerf 34. As a part of the invention, the second kerf 34 is of less width than the first kerf 26. Typically, the first kerf 26, as noted, is about 0.009"; the second kerf 34 is about one-third the width of the first kerf 26, or about 0.0003". Once cut then, the second kerf 34 leaves a peripheral resin coating 36 comprising a portion of the resin 28 on either side of the kerf that is about 0.003: in width or depth. See FIG. 5.

The crystal precursors 12 thus become PZT crystals 18 (FIG. 6) having a side coating 36 of the coating resin 28 against flaking of detritus therefrom into a disk drive suspension containing the crystals. PZT crystals 18 are suitable for microactuation of a disk drive suspension and have on their vertical sides 28 the peripheral coating 36 of resin 28 applied at, a first thickness, FIG. 4, and cut to a second thickness, FIG. 5, to block flaking of detritus from the crystal into a disk drive suspension.

As an intermediate product of the invention, there is provided the wafer 10 comprising a plurality of PZT crystal precursors separated by a first kerf 26, the first kerf being filled with a coating resin 28, and in which the first kerf has a second kerf 34 formed therein.

The invention thus provides a less costly solution to the PZT crystal contamination problem, by modifying the PZT crystal preparation at the wafer cutting level to have a coating formed on the crystal peripheries as a part of the crystal separation steps normally used through the use of a wider first kerf between adjacent crystals, later filled with coating resin, such as epoxy resin, and then cut with a second kerf in the first kerf to isolate the PZT crystals with the coating resin adhered prophylatically to their peripheries.

The foregoing objects are thus met.

I claim:

1. A peripherally coated PZT crystal made from a wafer comprising a plurality of PZT crystal precursors, by the method including cutting in a locus between adjacent precursors a first kerf of a predetermined width to cut apart the precursors and reveal the sides thereof, depositing into said first kerf a coating resin that fills said first kerf and coats said precursor sides, solidifying said coating resin in place, cutting in said solidified coating resin at said locus a second kerf of less width than said first kerf, said second kerf cutting through said coating and between said adjacent precursors in spaced relation to said precursor sides to again cut apart said precursors while maintaining said solidified coating resin in place on said precursor sides, whereby said precursors become PZT crystals having a side coating against flaking of detritus therefrom into a disk drive suspension containing said crystals.

2. A PZT crystal suitable for micrcoactuation of a disk drive suspension, said crystal having on the vertical sides thereof a peripheral coating of a resin applied at a first thickness and cut to a second thickness to block flaking of detritus from said crystal into a disk drive suspension.

3. The PZT crystal according to claim 1, in which resin coating comprises an epoxy resin.

4. A wafer comprising a plurality of PZT crystal precursors separated by a first kerf, said first kerf being filled with a coating resin.

5. The wafer according to claim 4, in which said first kerf has a second kerf formed therein.

6. The wafer according to claim 4, in which said coating resin is an epoxy resin.

7. The wafer according to claim 6, which said first kerf has a second kerf formed therein.

* * * * *